United States Patent
Kim

(10) Patent No.: US 7,414,232 B2
(45) Date of Patent: Aug. 19, 2008

(54) IMAGE SENSOR AND METHOD FOR FABRICATING THE SAME

(75) Inventor: Sang Sik Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/293,080

(22) Filed: Dec. 5, 2005

(65) Prior Publication Data

US 2006/0145055 A1    Jul. 6, 2006

(30) Foreign Application Priority Data

Dec. 30, 2004    (KR)    ....... 10-2004-0116514

(51) Int. Cl.
*H01L 27/00* (2006.01)
*H01L 21/00* (2006.01)
*H01L 31/062* (2006.01)
*H01J 3/14* (2006.01)
*G02B 27/10* (2006.01)

(52) U.S. Cl. ............... 250/208.1; 250/216; 257/294; 359/619; 438/69

(58) Field of Classification Search ............. 250/208.1, 250/214.1, 216, 226, 214 R; 257/432, 435, 257/233, 292, 294, 257, 258, 290–291, 431, 257/440; 438/69, 70, 73; 359/619–622
See application file for complete search history.

(56) References Cited

U.S. PATENT DOCUMENTS

| 4,721,999 | A | * | 1/1988 | Takemura et al. | 348/276 |
| 5,739,548 | A | * | 4/1998 | Shigeta et al. | 257/432 |
| 6,540,946 | B1 | * | 4/2003 | Assadi et al. | 264/1.38 |
| 6,897,086 | B2 | * | 5/2005 | Kim | 438/70 |
| 2005/0224694 | A1 | * | 10/2005 | Yaung | 250/208.1 |

FOREIGN PATENT DOCUMENTS

KR    1020000044582 A    7/2000

* cited by examiner

*Primary Examiner*—Georgia Y. Epps
*Assistant Examiner*—Don Williams
(74) *Attorney, Agent, or Firm*—McKenna Long & Aldridge LLP

(57) ABSTRACT

An image sensor having self-aligned microlenses and a method for fabricating the same. The image sensor includes a photodiode formed in a predetermined surface of a silicon substrate, a planarization layer formed above the silicon substrate, the planarization layer having a recess in correspondence to the photodiode, and a color filter layer having a plurality of color filters formed on the planarization layer by a photolithographic process, each color filter having a convex structure. An area of a focusing lens can be maximized, and a phase signal of unfocused light is absorbed to prevent its photo-electrical conversion, thereby obtaining excellent photosensitivity.

4 Claims, 2 Drawing Sheets

IMAGE SENSOR AND METHOD FOR FABRICATING THE SAME

CROSS-REFERENCE TO RELATED APPLICATIONS

This application claims the benefit of Korean Patent Application No. 10-2004-0116514 filed on Dec. 30, 2004, which is hereby incorporated by reference as if fully set forth herein.

BACKGROUND OF THE INVENTION

1. Field of the Invention

The present invention relates to an image sensor having self-aligned microlenses, and more particularly, an image sensor and a method for fabricating the same that maximizes an area of focusing lenses and absorbs a phase signal of unfocused light to prevent its photo-electrical conversion, thereby obtaining excellent photosensitivity.

2. Discussion of the Related Art

Resolution for an image sensors is determined by the number of photodiodes formed on the image plane that receives images. Accordingly, multi-pixel systems and miniaturization of a unit pixels are required. As the size of the unit pixel decreases, so does the area of a light-receiving portion. This requires focusing external images onto the image plane. To enhance photosensitivity, i.e., to increase the levels of sensed light, a focusing lens is used. The focusing lens is formed above or below a color filter layer formed as an array of color filters. To obtain a clear image it is necessary to have more light in focus than out of focus. Since the degree of focus of the incident light depends on the size of the sectional area of the focusing lens, clearer images are obtainable by maximizing the sectional area of focusing lens.

With the miniaturization and the multi-pixel system of the image sensor, more pixels per sectional area are formed in an on-chip type configuration. As pixel size decreases, the sizes of the filters of the color filter layer and the microlenses of a microlens layer also become smaller. As the pixel size becomes small, a photodiode area that receives light is also reduced, thereby reducing the photosensitivity. To compensate for the reduced photosensitivity, the photodiode area requires more light. To this end, a method of increasing an opening size and a method of forming focusing microlenses are provided. The openings are formed for the focusing lenses. These openings are created by forming a metal layer that serves as a wiring and as a light-shielding layer. In this manner, the light incident to the light-shielding layer is refracted toward the openings. Adhesion of the lenses varies as the size of focusing lenses is maximized. This causes image uniformity characteristics to suffer. The focusing of the lenses is also affected by the color filter layer, specifically, if the image signals of adjacent color filters are mixed they degrade the color information and contrast in the reproduced image. Additionally, it is difficult to form a precise pattern during alignment exposure due to the poor optical resolution caused by a mixture of pigment when the individual color filters of the color filter layer are formed. A planarization layer is also required because of the overlapping and gaps that occur between the color filters.

SUMMARY OF THE INVENTION

Accordingly, the present invention is directed to an image sensor and a method for fabricating the same that substantially obviates one or more problems due to limitations and disadvantages of the related art.

One advantage of the present invention is that it can provide an image sensor and a method for fabricating the same, which maximizes an area of focusing lenses and absorbs a phase signal of unfocused light to prevent its photo-electrical conversion, thereby obtaining excellent photosensitivity.

Another advantage of the present invention is that it can provide an image sensor and a method for fabricating the same, which compensates photosensitivity by focusing light.

Additional examples of advantages and features of the invention will be set forth in part in the description which follows, and in part will become apparent from the description, or by practice of the invention.

To achieve these and other advantages in accordance with an embodiment of the present invention, as embodied and broadly described herein, there is provided an image sensor, comprising a photodiode formed in a predetermined surface of a silicon substrate; a planarization layer formed above the silicon substrate, the planarization layer having a recess in correspondence to the photodiode; and a color filter layer having a plurality of color filters formed on the planarization layer by a photolithographic process, each color filter having a convex structure.

In another aspect of the present invention, there is provided a method for fabricating an image sensor. The method comprises forming a photodiode in a predetermined surface of a silicon substrate; forming a planarization layer above the silicon substrate, the planarization layer having a recess in correspondence to the photodiode; and forming a color filter layer having a plurality of color filters formed on the planarization layer by a photolithographic process, each color filter having a convex structure.

Therefore, the image sensor of the present invention may be fabricated simply by forming the lenses on the color filter layer having a convex structure and formed by spin coating or depositing a photoresist.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE INVENTION

Reference will now be made in detail to the embodiments of the present invention, examples of which are illustrated in the accompanying drawings. Wherever possible, like reference designations will be used throughout the drawings to refer to the same or similar parts.

Figure 1:
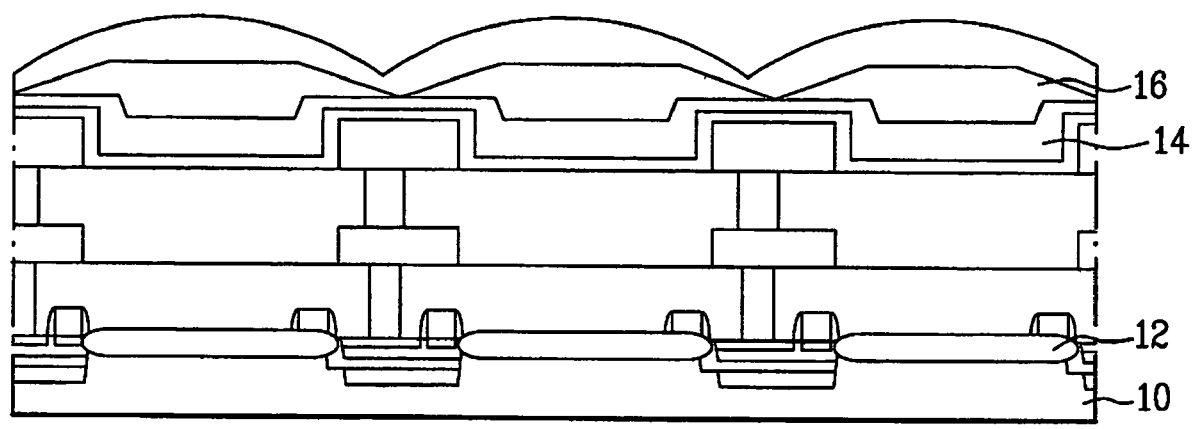
FIG. 1 is a sectional view illustrating a vertical structure of an image sensor according to the present invention.

Referring to FIG. 1, illustrating a vertical structure of an image sensor according to the present invention, a photodiode 12 is formed on a predetermined surface of a silicon substrate 10, and a color filter layer 16 having a plurality of color filters, each color filter having a convex structure, is formed on a planarization layer 14 of an organic material exhibiting good transparency. The planarization layer 14 is formed on an upper portion of the image sensor and has a recess corresponding to the photodiode 12. A plurality of microlenses 18 is formed on the color filter layer 16 in correspondence to the plurality of color filters to maintain the general profile of the color filter layer and to protect the color filters of the color filter layer.

Figure 2A:
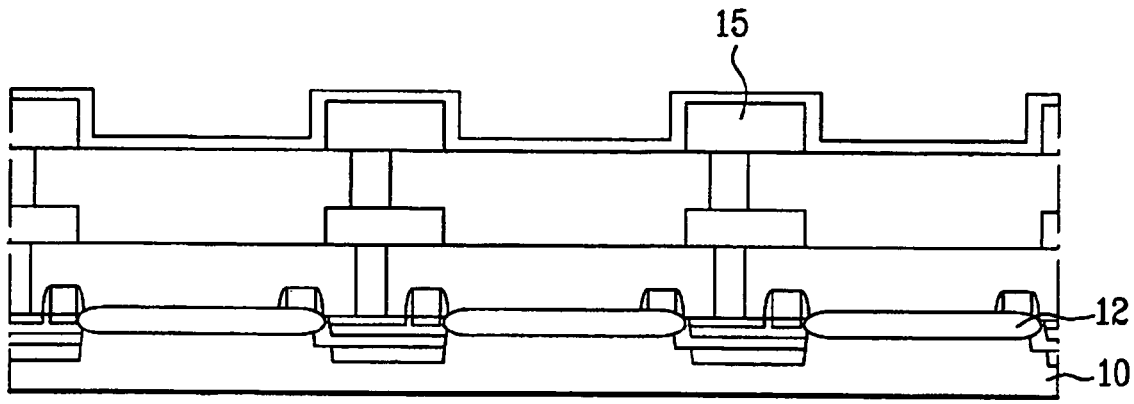
FIGS. 2A-2C are sectional views illustrating a vertical structure of an image sensor according to the present invention, showing the formation of a light-shielding layer, a planarization layer, and a color filter layer, respectively.

As shown in FIG. 2A that illustrates a vertical structure of an image sensor according to the present invention, the photodiode 12 is formed as a sub layer on a predetermined surface area of the silicon substrate 10. The image sensor of the present invention is formed on the silicon substrate as either a CCD-type or a CMOS-type image sensor, including a metal layer 15 that, in addition to establishing wiring connections as necessary, serves as a light-shielding layer to prevent light from entering a portion of the silicon substrate that is not covered by the photodiode. The light-shielding layer 15 is formed according to the fill factor and thus has a minimum line width that, according to the focal length of the microlens, renders negligible the normal shielding effects of the metal during ray tracing.

Figure 2B:
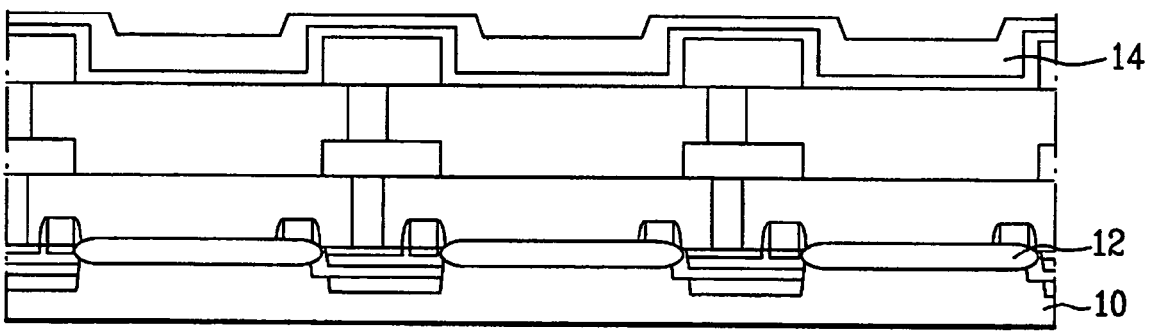

As shown in FIG. 2B, the planarization layer 14 is formed to improve the profile and uniformity of the color filter layer 16 to be formed thereon. The planarization layer 14 is formed of spin-on-glass having a good fill factor to effectively reduce a surface step (vertical differential) generated by the light-shielding layer 15. In addition to passing visible wavelengths of light, the planarization layer 14 also serves to passivate the metal of the light-shielding layer 15.

Figure 2C:
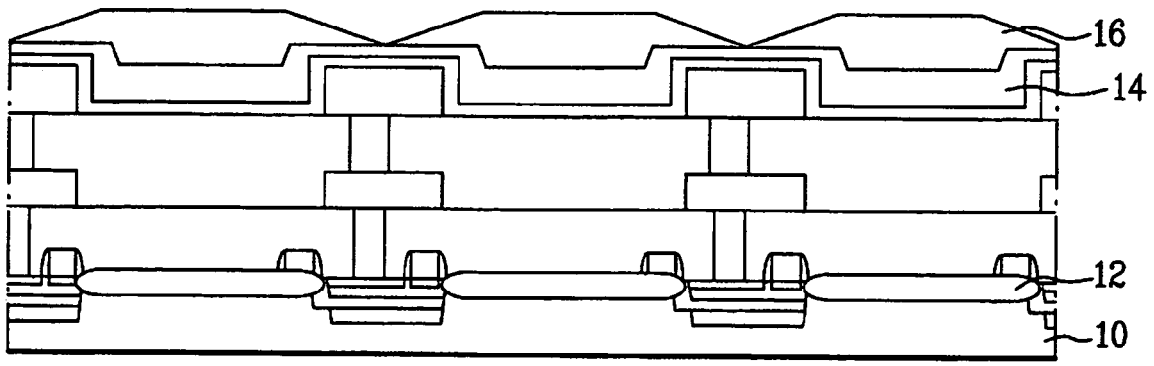

As shown in FIG. 2C, the color filters of the color filter layer 16 are formed on the planarization layer 14 for each pixel by, for example, a photolithographic process that is selectively performed three times to respectively form the color separation layers of the color filter layer 16, namely, a red filter array, a green filter array, and a blue filter array. The color filter layer 16 requires a precise pattern in accordance with a multi-pixel system and miniaturization of unit pixel. It is difficult to form a precise pattern of filters in the color filter layer by a pigment dispersing method because pigment is already present in a photoresist, and because the fabricating costs for such a method increase for higher resolutions. The step differential of the filters of the color filter layer can be controlled depending on a fill factor associated with the use of spin-on-glass to fill the gap. This affects the size and curvature of the microlenses. If a photoresist for microlenses is spin-coated such that a step differential is generated in the color filter layer, depending on the step size of the sub layers, the self-aligned microlenses may be formed without an etching and developing processes.

As described above, there is no need for a separate overcoat layer to align the microlenseses on the color filter layer, and since the microlenses are self-aligned, the number of process steps can be reduced. Therefore, by adopting the image sensor and the method for fabricating the same according to the present invention, the color filters of the color filter layer can be formed more stably and conveniently for each pixel to obtain clearer images. In forming the color filter layer, the planarization layer is simplified and the efficiency of color filter formation is increased. Since no overcoat layer is required and the lenses are self-aligned, the photolithographic process is simplified and stabilized. This reduces fabrication costs, promotes quality in the end product, and facilitates the development and application of next-generation products. When the whole surface area of the microlenses is used, photosensitivity is improved, which in turn improves image characteristics and sensor quality.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. An image sensor, comprising:
    a photodiode formed in a predetermined surface of a silicon substrate;
    a planarization layer formed above the silicon substrate, said planarization layer having a recess corresponding to the photodiode;
    a color filter layer having a plurality of color filters formed directly on said planarization layer by a photolithographic process, each color filter having a convex structure; and
    a plurality of microlenses formed on said color filter layer corresponding to the plurality of color filters,
    wherein said plurality of microlenses is formed by means of spin coating a photoresist for the microlenses in a state which step differentials are generated by means of the convex structure after depositing the photoresist on said color filter layer.

2. The image sensor according to claim 1, wherein said planarization layer is formed of spin-on-glass.

3. A method for fabricating an image sensor, the method comprising:
    forming a photodiode in a predetermined surface of a silicon substrate;
    forming a planarization layer above the silicon substrate, the planarization layer having a recess corresponding to the photodiode;
    forming a color filter layer having a plurality of color filters formed directly on the planarization layer by a photolithographic process, each color filter having a convex structure; and
    forming a plurality of microlenses on the color filter layer corresponding to the plurality of color filters,
    wherein the step of forming the microlenses comprises:
    depositing a photoresist for the microlenses on the color filter layer;
    forming the microlenses by spin coating the photoresist in a state which step differentials are generated by means of the convex structure.

4. The method according to claim 3, wherein the planarization layer is formed of spin-on-glass.

* * * * *